US012282231B2

(12) United States Patent
Akiyama et al.

(10) Patent No.: US 12,282,231 B2
(45) Date of Patent: Apr. 22, 2025

(54) LIQUID CRYSTAL DISPLAY PANEL, DISPLAY DEVICE, AND METHOD FOR MANUFACTURING ACTIVE MATRIX SUBSTRATE

(71) Applicant: Sharp Display Technology Corporation, Kameyama (JP)

(72) Inventors: Hiroto Akiyama, Kameyama (JP); Hiroyuki Ohgami, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 18/614,497

(22) Filed: Mar. 22, 2024

(65) Prior Publication Data

US 2024/0377687 A1 Nov. 14, 2024

(30) Foreign Application Priority Data

May 9, 2023 (JP) .................................. 2023-077520

(51) Int. Cl.
*G02F 1/1339* (2006.01)
*G02F 1/1362* (2006.01)
(52) U.S. Cl.
CPC .... *G02F 1/13394* (2013.01); *G02F 1/136209* (2013.01); *G02F 1/136222* (2021.01)
(58) Field of Classification Search
None
See application file for complete search history.

(56) References Cited

U.S. PATENT DOCUMENTS

| 2003/0058399 | A1* | 3/2003 | Miyashita | G02F 1/13394 349/156 |
| 2015/0253607 | A1* | 9/2015 | Cho | G02F 1/1337 349/110 |
| 2018/0180920 | A1 | 6/2018 | Zhang et al. | |
| 2020/0174300 | A1* | 6/2020 | Cheng | H10D 86/0231 |
| 2021/0026211 | A1* | 1/2021 | Yoshida | H01L 27/1225 |

FOREIGN PATENT DOCUMENTS

JP 2019-525256 A 9/2019

* cited by examiner

*Primary Examiner* — Phu Vu
(74) *Attorney, Agent, or Firm* — ScienBiziP, P.C.

(57) ABSTRACT

A liquid crystal display panel includes an active matrix substrate including a gate layer including gate lines, a source layer including source lines, and an alignment film covering the gate layer and the source layer, a color filter substrate, placed opposite the active matrix substrate, that includes a black matrix including, in planar view, first portions separately overlapping each of the source lines and second portions crossing the first portions and separately overlapping each of the gate lines and spacers disposed in cross regions in which the first portions and the second portions cross each other, and a liquid crystal layer disposed between the active matrix substrate and the color filter substrate. The active matrix substrate further includes bank portions provided in positions surrounding the spacers within regions overlapping the cross regions in planar view.

5 Claims, 7 Drawing Sheets

LIQUID CRYSTAL DISPLAY PANEL, DISPLAY DEVICE, AND METHOD FOR MANUFACTURING ACTIVE MATRIX SUBSTRATE

CROSS-REFERENCE TO RELATED APPLICATION

The present application claims priority from Japanese Application No. JP2023-77520, filed on May 9, 2023, the content of which is hereby incorporated by reference into this application.

BACKGROUND

1. Field

The present disclosure relates to a liquid crystal display panel, a display device, and a method for manufacturing an active matrix substrate.

2. Description of the Related Art

There has been known a liquid crystal display panel provided with columnar spacers for making the thickness of a liquid crystal layer stay the same. The application of an external force to such a liquid crystal display panel may cause displacement of the spacers. The displacement of photospacers out of a light-shielding region may cause display unevenness on a display surface. This has undesirably caused a deterioration in display quality.

To address this problem, Japanese Unexamined Patent Application Publication (Translation of PCT Application) No. 2019-525256 discloses a liquid crystal display panel including a color film substrate and an array substrate that are provided opposite and away from each other and photospacers located between the two substrates. This liquid crystal display panel is configured such that contact holes are made in a side of the array substrate that faces the color film substrate, that projecting columns are provided on a side of the color film substrate that faces the array substrate, that the height of each of the projecting columns is greater than the height of each of the photospacers, and that the projecting columns have their tops inserted in the contact holes.

However, the liquid crystal display panel disclosed in Japanese Unexamined Patent Application Publication (Translation of PCT Application) No. 2019-525256 needs the contact holes to be larger in diameter than the photospacers. Further, the liquid crystal display panel disclosed in Japanese Unexamined Patent Application Publication (Translation of PCT Application) No. 2019-525256 may suffer from electrical display defects, as the photospacers are always in contact with the contact holes. It is therefore desirable to provide a liquid crystal display panel of high display quality, a display device, and a method for manufacturing an active matrix substrate.

SUMMARY

According to an aspect of the disclosure, there is provided a liquid crystal display panel including an active matrix substrate, a color filter substrate placed opposite the active matrix substrate, and a liquid crystal layer disposed between the active matrix substrate and the color filter substrate. The active matrix substrate includes a gate layer including a plurality of gate lines extending in a first direction, a source layer including a plurality of source lines crossing the plurality of gate lines and extending in a second direction, and an alignment film covering the gate layer and the source layer. The color filter substrate includes a black matrix including, in planar view, a plurality of first portions separately overlapping each of the plurality of source lines of the active matrix substrate and a plurality of second portions crossing the plurality of first portions and separately overlapping each of the plurality of gate lines and spacers, disposed in at least some of a plurality of cross regions in which the plurality of first portions and the plurality of second portions cross each other, that project toward the active matrix substrate. The active matrix substrate further includes bank portions, provided in positions surrounding the spacers within regions overlapping the cross regions in planar view, that project toward the color filter substrate.

DESCRIPTION OF THE EMBODIMENTS

1. Description of the Problems

As a low-price liquid crystal display panel, there is a non-glass-slimmed liquid crystal display panel manufactured with omission of slimming, which is a processing step of thinning a glass substrate. This brings about a reduction in manufacturing cost.

The inventors conducted an experiment in which an external pressure was applied to a display device according to a comparative example mounted with a non-glass-slimmed liquid crystal display panel. Specifically, in the experiment, a laptop personal computer mounted with the non-glass-slimmed liquid crystal display panel was pressed with a jig approximately 30 mm in diameter from outside while being closed. As a result of this experiment, the occurrence of display unevenness on a screen was observed.

As a reason for this, the inventors came up with the idea that the non-glass-slimmed liquid crystal display panel according to the comparative example suffered from a great shift length in a direction parallel with a surface by being strongly pressed while the positions of spacers, provided on a black matrix of a color filter substrate, that projected toward a liquid crystal layer were shifting in the direction parallel with the surface. That is, the non-glass-slimmed liquid crystal display panel according to the comparative example was considered to suffer from leakage of light due to contact between the tops of the spacers and a liquid crystal alignment film when an increase in shift length in the direction parallel with the surface due to an external pressure brought the positions of the spacers out of the black matrix.

Figure 1:
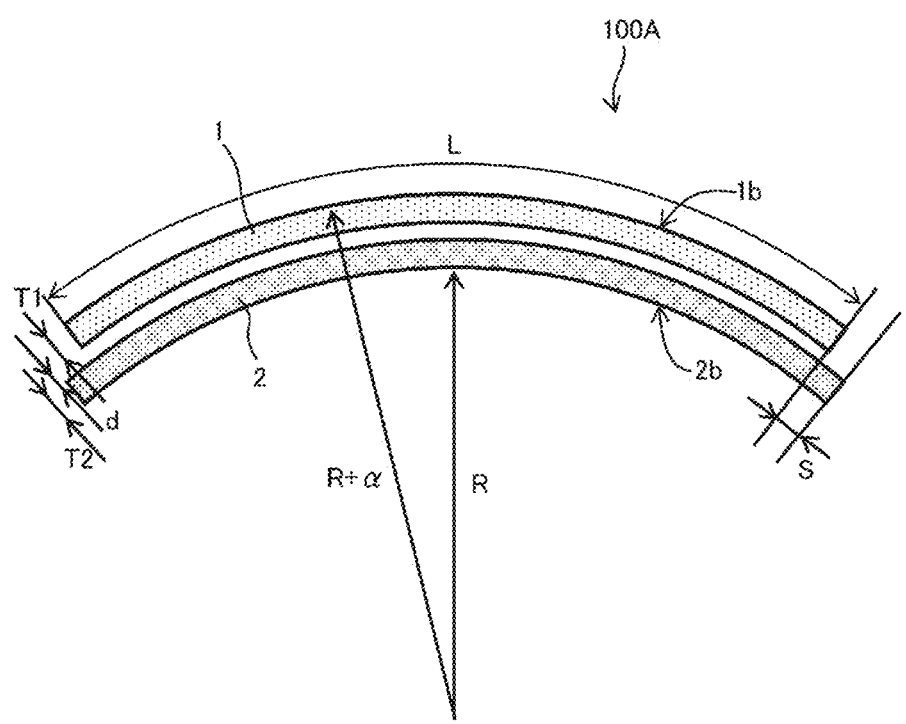
FIG. 1 is a schematic view for explaining a relationship between a shift length and the thickness of a glass substrate in the presence of the application of an external force to a liquid crystal display panel according to a comparative example.
Figure 2:
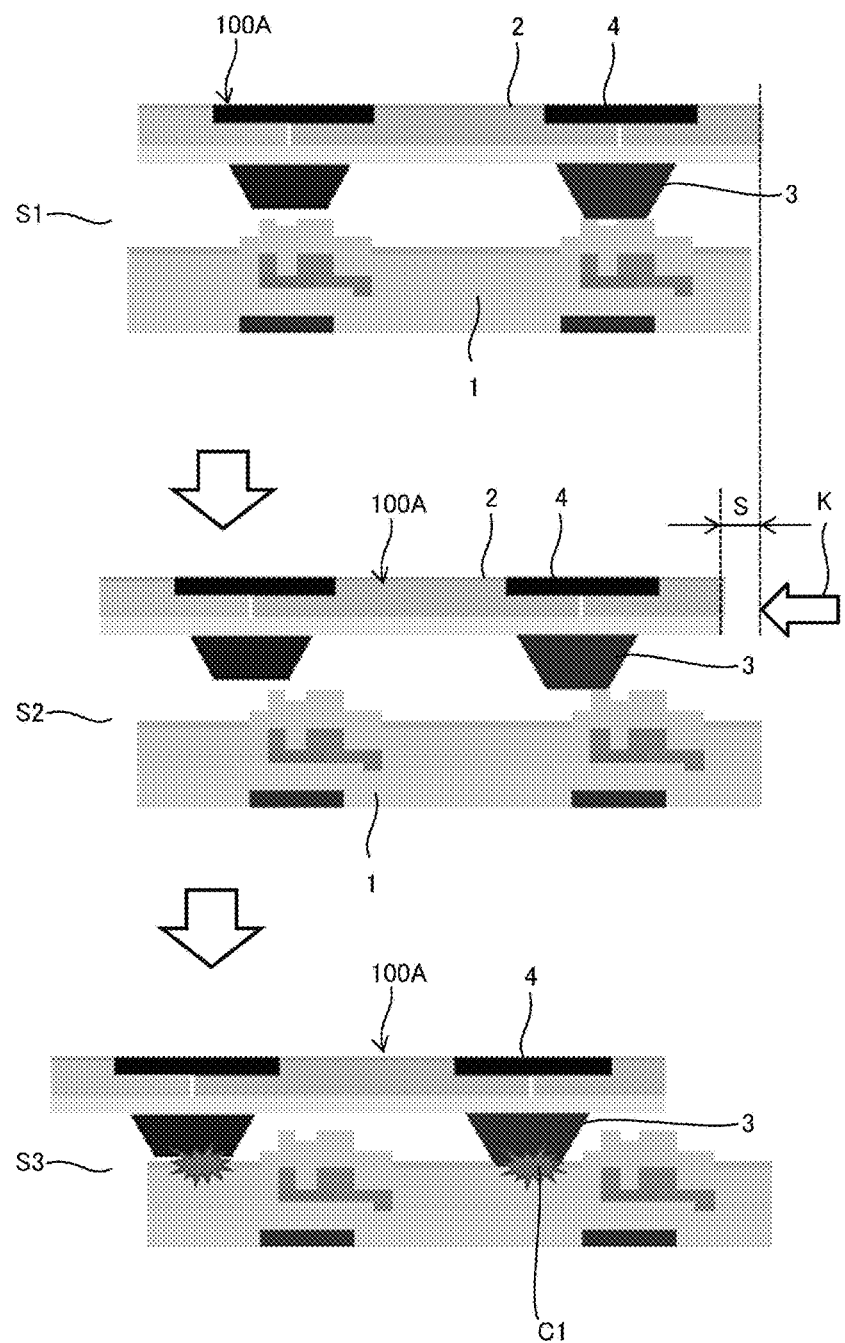
FIG. 2 is a schematic view representing a mechanism of deformation in the presence of the application of an external force to the liquid crystal display panel according to the comparative example.

Details are described with reference to FIGS. 1 and 2. FIG. 1 is a schematic view for explaining a relationship between a shift length and the thickness of a glass substrate in the presence of the application of an external force to a liquid crystal display panel 100A according to the comparative example. FIG. 2 is a schematic view representing a mechanism of deformation in the presence of the application of an external force to the liquid crystal display panel 100A according to the comparative example.

FIG. 1 represents a state of the liquid crystal display panel 100A according to the comparative example being bent by an external force. The liquid crystal display panel 100A includes an active matrix substrate 1 having a thickness T1 and a color filter substrate 2 having a thickness T2. The active matrix substrate 1 and the color filter substrate 2 are stacked at a distance d from each other. FIG. 1 represents a state of the liquid crystal display panel 100A being bent by an external force so that a back surface 1b of the active matrix substrate 1 is curved outward.

At this point in time, the active matrix substrate 1 and the color filter substrate 2 are different in radius of deflection from each other. That is, a front surface 2b of the color filter substrate 2 deflects with a radius R, and the back surface 1b of the active matrix substrate 1 deflects with a radius (R+α). Therefore, the back surface 1b of the active matrix substrate 1 and the front surface 2b of the color filter substrate 2 shift in position from each other with a shift length S in a circumferential direction due to a deflection.

In a case where the radius R is sufficiently larger than the respective thicknesses T1 and T2 of the active matrix substrate 1 and the color filter substrate 2 and the distance d, the shift length S is expressed by Formula (1) below through the use of the length L of the liquid crystal display panel 100A in the absence of a deflection and the sum T of the thicknesses T1 and T2.

$$S=L(T+d)/(2R) \quad (1)$$

As shown in FIG. 2, the color filter substrate 2 includes a black matrix 4 serving as a light-shielding region. In positions on the color filter substrate 2 that overlap the black matrix 4 in planar view, columnar spacers 3 projecting toward the active matrix substrate 1 are provided. In step S1, in which the liquid crystal display panel 100A is in a normal condition in which no external pressure is being applied, the tops of the spacers 3 make contact with a front surface of the active matrix substrate 1.

When a great external force is locally applied to the liquid crystal display panel 100A, the color filter substrate 2 shifts with the shift length S in a direction K with respect to the active matrix substrate 1 in step S2. The direction K is equivalent to the circumferential direction in which the active matrix substrate 1 and the color filter substrate 2 deflect, and in a case where the radius of deflection R is sufficiently large, the direction K is equivalent to a direction parallel with surfaces of the active matrix substrate 1 and the color filter substrate 2.

Further, when a great external force is locally applied to the liquid crystal display panel 100A, the color filter substrate 2 is pressed against the active matrix substrate 1 in step S3 while shifting with the shift length S in the direction K with respect to the active matrix substrate 1. This brings the tops of the spacers 3 into contact with an alignment film disposed on the front surface of the active matrix substrate 1. A breakage of the alignment film causes the alignment of the liquid crystal layer to become disrupted at the position of the breakage.

In a case where the liquid crystal display panel 100A is a non-glass-slimmed liquid crystal display panel, the sum T of the thicknesses T1 and T2 increases, as the glass substrate is thick. Therefore, according to Formula (1), the shift length S in the direction K increases. As a result, in a case where the liquid crystal display panel 100A is a non-glass-slimmed liquid crystal display panel, a deflection or deformation caused an external force increases the range of movement of the spacers 3 in contact with the alignment film and also increases the range of disruption of the alignment of the liquid crystal layer. When a position C1 of disruption of the alignment of the liquid crystal layer exceeds the range of a planimetric overlap with the black matrix 4 in a normal condition, the disruption of the alignment of the liquid crystal layer starts to be seen in the normal condition of step S1. That is, display unevenness occurs.

The inventors studied the cause of display unevenness that occurs when an external force is applied to a non-glass-slimmed liquid crystal display panel, and found a liquid crystal display panel, a display device, and a method for manufacturing an active matrix substrate with a reduction in display unevenness attributed to the aforementioned cause.

2. Brief Overview of Liquid Crystal Display Panel, Display Device, and Method for Manufacturing Active Matrix Substrate (1) A liquid crystal display panel according to an embodiment includes an active matrix substrate, a color filter substrate placed opposite the active matrix substrate, and a liquid crystal layer disposed between the active matrix substrate and the color filter substrate. The active matrix substrate includes a gate layer including a plurality of gate lines extending in a first direction, a source layer including a plurality of source lines crossing the plurality of gate lines and extending in a second direction, and an alignment film covering the gate layer and the source layer. The color filter substrate includes a black matrix including, in planar view, a plurality of first portions separately overlapping each of the plurality of source lines of the active matrix substrate and a plurality of second portions crossing the plurality of first portions and separately overlapping each of the plurality of gate lines and spacers, disposed in at least some of a plurality of cross regions in which the plurality of first portions and the plurality of second portions cross each other, that project toward the active matrix substrate. The active matrix substrate further includes bank portions, provided in positions surrounding the spacers within regions overlapping the cross regions in planar view, that project toward the color filter substrate.

In a case where an external pressure is applied to a display device mounted with the liquid crystal display panel and an external force is applied to the liquid crystal display panel, the active matrix substrate and the color filter substrate, which are provided opposite each other, each undergo a deflection, and due to the difference in thickness between the active matrix substrate and the color filter substrate, a shift occurs in a direction parallel with surfaces of the active matrix substrate and the color filter substrate. According to the inventors' simulation, this shift increases as the thickness of a liquid crystal display panel increases like in the case of, for example, a non-glass-slimmed liquid crystal display panel. By the color filter substrate including, in the cross regions, the spacers projecting toward the active matrix substrate and the active matrix substrate including, in the positions surrounding the spacers within the regions overlapping the cross regions in planar view, the bank portions projecting toward the color filter substrate, shifts of the spacers are inhibited by the bank portions, and as a result, shifts of the active matrix substrate and the color filter substrate are inhibited.

Therefore, in the liquid crystal display panel according to the embodiment, the range of movement of the spacers in contact with the alignment film can be made smaller than in the liquid crystal display panel according to the comparative example, which does not have bank portions. As a result, the range of disruption of the alignment of the liquid crystal layer can be made smaller than in the liquid crystal display panel according to the comparative example.

Further, since, in the liquid crystal display panel according to the embodiment, the bank portions are disposed in the regions overlapping the cross regions in planar view, the range of movement of the spacers in contact with the alignment film can fall within the regions overlapping the cross regions in planar view. Therefore, in the liquid crystal display panel according to the embodiment, the disruption of the alignment of the liquid crystal layer caused by the spacers making contact with the alignment film is brought out of sight by the black matrix. This results in a reduction in display unevenness.

(2) In the liquid crystal display panel of (1), each of the bank portions may be formed by at least either the gate layer or the source layer that the alignment film covers. This makes it possible to manufacture the active matrix substrate using at least either the gate layer or the source layer without preparing, separately from the gate layer and the source layer, a layer for forming the bank portions. This brings about a reduction in manufacturing cost.

(3) In the liquid crystal display panel of (2), the formation of each of the bank portions by at least either the gate layer or the source layer that the alignment film covers may for example be the formation of each of the bank portions by either the gate layer or the source layer that the alignment film covers.

(4) In the liquid crystal display panel of (2), the formation of each of the bank portions by at least either the gate layer or the source layer that the alignment film covers may for example be the formation of each of the bank portions by both the gate layer and the source layer that the alignment film covers. In either case, the active matrix substrate can be manufactured with a reduction in manufacturing cost.

(5) In the liquid crystal display panel of any one of (1) to (4), each of the bank portions may be disposed in an edge portion of a corresponding one of the regions overlapping the cross regions in planar view. This allows the color filter substrate and the active matrix substrate to deform to some extent when an external force is applied to the liquid crystal display panel. This results in relaxation of a stress that is placed on the liquid crystal display panel by an external force.

(6) A display device according to an embodiment includes the liquid crystal display panel of any one of (1) to (5). This brings about a reduction in display unevenness in the display device.

(7) A method for manufacturing an active matrix substrate according to an embodiment is a method for manufacturing an active matrix substrate that is mounted in a liquid crystal display panel, and includes forming, over a substrate, a gate layer including a plurality of gate lines extending in a first direction, forming, at a higher layer than the gate layer, a source layer including a plurality of source lines crossing the plurality of gate lines and extending in a second direction, and forming, at a higher layer than the source layer, an alignment film covering the gate layer and the source layer. In the liquid crystal display panel, a color filter substrate placed opposite the active matrix substrate behind a liquid crystal layer includes a black matrix including, in planar view, a plurality of first portions separately overlapping each of the plurality of source lines of the active matrix substrate and a plurality of second portions crossing the plurality of first portions and separately overlapping each of the plurality of gate lines and spacers, disposed in at least some of a plurality of cross regions in which the plurality of first portions and the plurality of second portions cross each other, that project toward the active matrix substrate. At least either forming the gate layer or forming the source layer includes forming, in positions surrounding the spacers within regions overlapping the cross regions in planar view, bank portions projecting toward the color filter substrate.

Display unevenness can be reduced in a liquid crystal display panel in which an active matrix substrate manufactured by the manufacturing method according to the embodiment and the aforementioned color filter substrate are placed opposite each other.

Figure 3:
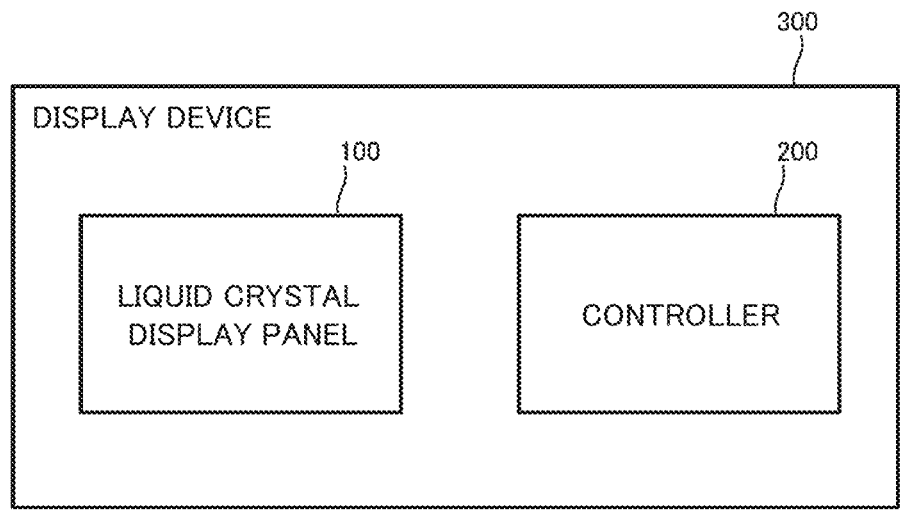
FIG. 3 is a schematic view of a configuration of a display device according to an embodiment.

3. Examples of Liquid Crystal Display Panel, Display Device, and Method for Manufacturing Active Matrix Substrate First Embodiment Description of Display Device FIG. 3 is a schematic view of a configuration of a display device 300 according to the present embodiment. The display device 300 includes a liquid crystal display panel 100 and a controller 200. The liquid crystal display panel 100 has a function of displaying a picture or an image and a function of detecting a touch from an indicator and a touch position. The controller 200 executes each control process in the display device 300 in accordance with a touch position acquired from the liquid crystal display panel 100.

Description of Liquid Crystal Display Panel

Figure 4:
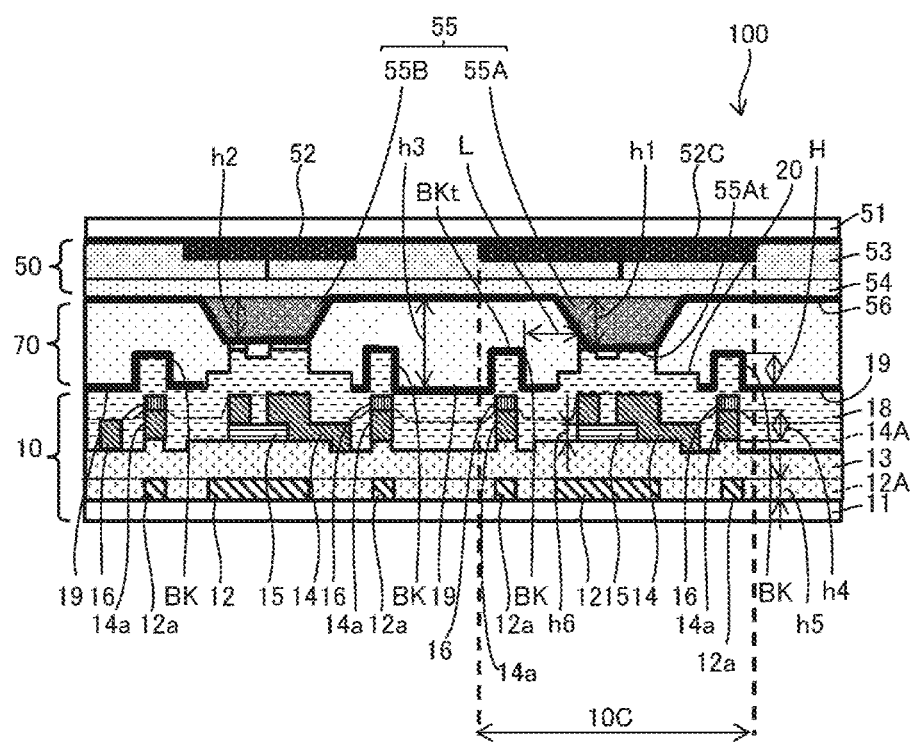
FIG. 4 is a schematic cross-sectional view of a liquid crystal display panel according to a first embodiment.
Figure 5:
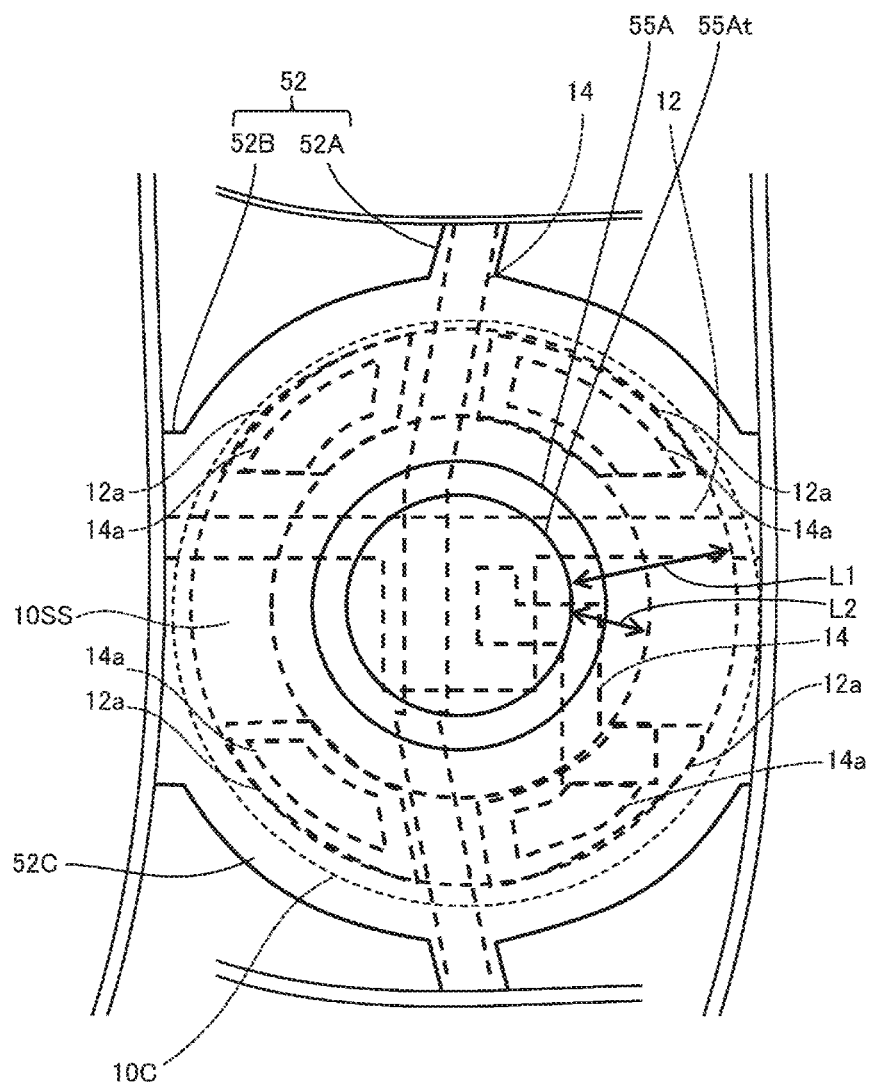
FIG. 5 is a schematic plan view of part of a color filter substrate of the liquid crystal display panel.

FIG. 4 is a schematic cross-sectional view of the liquid crystal display panel 100. The liquid crystal display panel 100 includes an active matrix substrate 10, a color filter substrate 50 placed opposite the active matrix substrate 10, and a liquid crystal layer 70 disposed between the active matrix substrate 10 and the color filter substrate 50. FIG. 5 is a schematic plan view of part of the color filter substrate 50.

The active matrix substrate 10 includes a first substrate 11. The first substrate 11 is made of a transparent material such as glass or resin.

The active matrix substrate 10 includes a plurality of gate lines 12 disposed over the first substrate 11. The plurality of gate lines 12 each extend in a first direction over the first substrate 11 and, over the first substrate 11, are arrayed at predetermined spacings in a second direction orthogonal to the first direction. A gate layer 12A including the plurality of gate lines 12 is made of a metal material such as aluminum, copper, titanium, molybdenum, chromium, or an alloy thereof.

The active matrix substrate 10 includes a gate insulating film 13 disposed over the plurality of gate lines 12. The gate insulating film 13 is disposed over the first substrate 11 so as to cover the gate lines 12. The gate insulating film 13 is made of an inorganic material such as silicon oxide, silicon nitride, or silicon oxynitride.

The active matrix substrate 10 includes a plurality of source lines 14 disposed over the gate insulating film 13. The plurality of source lines 14 each extend in the second direction over the gate insulating film 13 as a whole and, over the gate insulating film 13, are placed at predetermined spacings in the first direction. Accordingly, the plurality of source lines 14 cross the plurality of gate lines 12 via the gate insulating film 13. A source layer 14A including the plurality of source lines 14 is made of a metal material such as aluminum, copper, titanium, molybdenum, chromium, or an alloy thereof.

In a region surrounded by a pair of adjacent ones of the plurality of gate lines 12 and a pair of adjacent ones of the plurality of source lines 14, a thin-film transistor (TFT; not illustrated) 15 and a pixel electrode 16 (not illustrated) are disposed. The TFT 15 includes a gate electrode on a front surface of a substrate, a semiconductor layer disposed over a gate insulating film covering the top of the gate electrode, and source and drain electrodes disposed on both sides thereof (not illustrated).

The gate lines 12 overlap the semiconductor layer and the drain electrode of the TFT 15 via the gate insulating film. The source lines 14 are electrically connected to the drain electrode of the TFT 15. The drain electrode is further electrically connected to the semiconductor layer and the pixel electrode.

The active matrix substrate 10 includes an interlayer insulating film 18 disposed over the first substrate 11 so as to cover the gate lines 12, the source lines 14, the TFT 15, and the pixel electrode 16. The interlayer insulating film 18 may be made of an inorganic material such as silicon oxide, silicon nitride, or silicon oxynitride, or may be made of an organic material such as acrylic resin.

The active matrix substrate 10 includes a common electrode 19 disposed over the first substrate 11 so as to cover the interlayer insulating film 18. The common electrode 19 may be made of a transparent electrode material. As one example, the common electrode 19 divided for each individual pixel or for each group of pixels. As another example, the common electrode 19 may be a wholly-continuous single solid electrode.

The active matrix substrate 10 includes a first alignment film 20 disposed over the first substrate 11 so as to cover the common electrode 19 and the interlayer insulating film 18. The first alignment film 20 is for example made of polyimide resin or other materials, and has its front surface subjected to an alignment process such as a photo-alignment method or a rubbing method.

The color filter substrate 50 includes a second substrate 51. The second substrate 51 is made of a transparent material such as glass or resin.

The color filter substrate 50 includes a black matrix 52 located over the second substrate 51. The black matrix 52 is a light-shielding region and, for example, is constituted by a stacked structure of a resin material, such as black resin, that hardly transmits light or a single-layer metal film or metal layer of chromium or other metals and a layer composed of a metal oxide.

The black matrix 52 include, in planar view, a plurality of first portions 52A separately overlapping each of the plurality of source lines 14 of the active matrix substrate 10 and a plurality of second portions 52B separately overlapping each of the plurality of gate lines 12 (see FIG. 5). The plurality of first portions 52A and the plurality of second portions 52B cross each other and form cross regions 52C.

The color filter substrate 50 includes a plurality of color filters 53 disposed over the second substrate 51. The plurality of color filters 53 are disposed separately in each of a plurality of regions defined by the plurality of first portions 52A and the plurality of second portions 52B of the black matrix 52.

The color filter substrate 50 includes an overcoat layer 54 disposed over the second substrate 51 so as to cover the color filters 53. The overcoat layer 54 is for example a dielectric made of a resin material or other materials.

The color filter substrate 50 includes a plurality of columnar spacers 55, disposed in at least some of the cross regions 52C in which the first and second portions 52A and 52B of the black matrix 52 over the overcoat layer 54 cross, that project toward the active matrix substrate 10. As one example, the spacers 55 are disposed in all of the cross regions 52C. The spacers 55 are for example constituted by a photoresist.

The spacers 55 may include a first spacer 55A and a second spacer 55B. The height h1 of the first spacer 55A is greater than the height h2 of the second spacer 55B (see FIG. 4).

The color filter substrate 50 includes a second alignment film 56 disposed over the overcoat layer 54 so as to cover the spacers 55. The second alignment film 56 is for example made of polyimide resin or other materials, and has its front surface subjected to an alignment process such as a photo-alignment method or a rubbing method.

Description of Bank Portion

The gate layer 12A formed over the first substrate 11 includes a bank-use gate portion 12a. The bank-use gate portion 12a is a metal film formed of the same metal material as the gate lines 12 and constitutes the after-mentioned bank portion BK. Accordingly, the bank-use gate portion 12a has the same height (thickness) h5 as the gate lines 12. The bank-use gate portion 12a is provided in a position surrounding the first spacer 55A. The position surrounding the first spacer 55A refers to a continuously or intermittently circular or substantially circular position centered or substantially centered at the first spacer 55A.

Further, the source layer 14A formed over the gate insulating film 13 includes a bank-use source portion 14a. The bank-use source portion 14a is a metal film formed of the same metal material as the source lines 14 and constitutes the after-mentioned bank portion BK. Accordingly, the bank-use source portion 14a has the same height (thickness) h4 as the source lines 14. The bank-use source portion 14a is disposed in such a position that at least part thereof overlaps the bank-use gate portion 12a in planar view. That is, the bank-use source portion 14a too is provided in the position surrounding the first spacer 55A.

An upper surface of the interlayer insulating film 18 has asperities corresponding to a structure that the interlayer insulating film 18 covers, and the upper surface is not planarized. In positions where the interlayer insulating film 18 covers the bank-use gate portion 12a and the bank-use source portion 14a, which are disposed to overlap each other in planar view, the interlayer insulating film 18 has shapes projecting toward the color filter substrate 50 in conformance with the heights h5 and h4 of the bank-use gate portion 12a and the bank-use source portion 14a. Therefore, in positions where the first alignment film 20 covers the bank-use gate portion 12a and the bank-use source portion 14a too, an upper surface of the first alignment film 20 has shapes projecting toward the color filter substrate 50 in conformance with these projecting shapes. Accordingly, in the position surrounding the first spacer 55A, in which the bank-use gate portion 12a and the bank-use source portion 14a are disposed, a bank portion BK projecting toward the color filter substrate 50 is formed with an upper surface as the first alignment film 20.

Since the bank-use gate portion 12a and the bank-use source portion 14a are disposed in a continuously or intermittently circular or substantially circular shape centered at or substantially centered at the first spacer 55A, the bank portion BK is in a continuously or intermittently circular or substantially circular shape centered at or substantially centered at the first spacer 55A. That is, the bank portion BK is formed in the position surrounding the first spacer 55A. It should be noted that a side surface of the bank portion BK may be parallel to a direction normal to a front surface of the active matrix substrate 10 or may be inclined with respect to the normal direction.

The height H of the bank portion BK is obtained from the sum of the height h5 of the bank-use gate portion 12a and the height h4 of the bank-use source portion 14a. The height h5 is equivalent to the height (gate layer thickness) of the gate lines 12, and the height 4 is equivalent to the height (source layer thickness) of the source lines 14. The sum of the height h5 of the bank-use gate portion 12a and the height h4 of the bank-use source portion 14a is approximately ¼ to ⅕ of the height h1 of the first spacer 55A. The sum of the height h5 and the height h4 may be 1/3.3 to 1/5.4 of the height h1.

As one example, assuming that the height h1 of the first spacer 55A is 2.14 to 2.50 µm, the sum of the height h5 and the height h4 is approximately 0.39 to 0.75 µm. That is, the height h5 of the bank-use gate portion 12a and the height h4 of the bank-use source portion 14a are each 0.20 to 0.38 µm. At this point in time, as an example, assuming that the height (cell thickness) h3 of the liquid crystal layer 70 is 3.00 µm and the height h6 of the TFT (semiconductor layer) 15 is 0.10 µm, a gap between a top 55At of the first spacer 55A and a top BKt of the bank portion BK is calculated to be −0.36 to 0.06 µm. This brings the top 55At of the first spacer 55A and the top BKt of the bank portion BK into such a relationship as to make contact with each other in a height direction (thickness direction).

The bank-use gate portion 12a and the bank-use source portion 14a are both provided within a region 10C overlapping a cross region 52C in planar view. The bank-use gate portion 12a and the bank-use source portion 14a may be provided in an edge portion 10SS of the region 10C (see FIG. 5). In view of the bonding together of the active matrix substrate 10 and the color filter substrate 50, a predetermined gap (of, for example, approximately 5 µm) is provided from an end portion of the top 55At of the first spacer 55A to an inner edge of the edge portion 10SS. An outer edge of the edge portion 10SS needs only be within an outer edge of the region 10C. Thus, the bank portion BK is disposed in the region 10C overlapping the cross region 52C in planar view.

Method for Manufacturing Active Matrix Substrate

Figure 6:
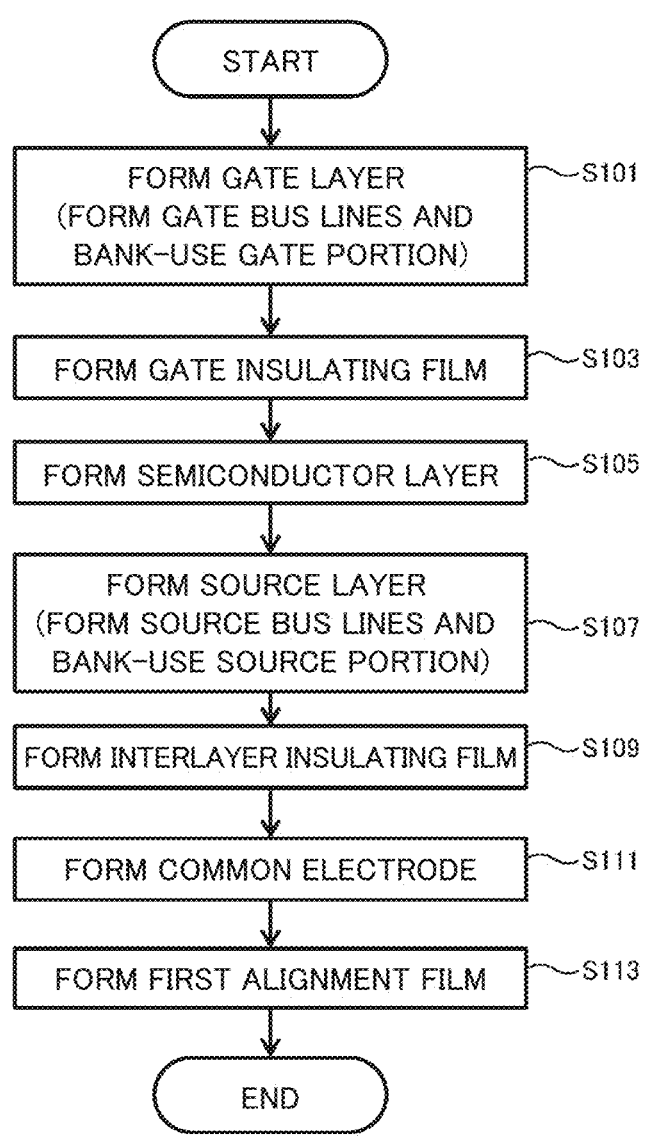
FIG. 6 is a flow chart representing an example of a sequence of some actions making up a method for manufacturing an active matrix substrate according to an embodiment.

FIG. 6 is a flow chart representing an example of a sequence of some actions making up a method for manufacturing an active matrix substrate 10. First, a gate layer 12A is formed by a metal film over a first substrate 11 such as a glass substrate (step S101).

The gate layer 12A includes a plurality of gate lines 12. In step S101, the plurality of gate lines 12 are formed over the first substrate 11 so as to each extend in the first direction and be arrayed at predetermined spacings in the second direction. Further, the gate layer 12A includes a bank-use gate portion 12a. Therefore, in step S101, furthermore, the bank-use gate portion 12a is formed in an edge portion 10SS within a region 10C corresponding to a cross region 52C and into a continuously or intermittently circular or substantially circular shape centered at or substantially centered at a first spacer 55A.

Next, a gate insulating film 13 is formed by an inorganic insulating film so as to cover the gate layer 12A thus formed (step S103). At a higher layer than the gate insulating film 13 thus formed, a semiconductor layer is formed, for example, by an oxide semiconductor single layer (step S105).

A source layer 14A is formed by a metal film over the gate insulating film 13 so as to cover the semiconductor layer thus formed (step S107). The source layer 14A includes a plurality of source lines 14 and a bank-use source portion 14a. Accordingly, in step S107, the plurality of source lines 14 and the bank-use source portion 14a are formed over the gate insulating film 13.

The source layer 14A includes a plurality of source lines 14. In step S107, the plurality of source lines 14 are formed over the gate insulating film 13 so as to each extend in the second direction and be arrayed at predetermined spacings in the first direction. Further, the source layer 14A includes a bank-use source portion 14a. Therefore, in step S107, the bank-use source portion 14a is formed in the edge portion 10SS within the region 10C corresponding to the cross region 52C and in a position overlapping the bank-use gate portion 12a in planar view. That is, in step S107, the bank-use source portion 14a is formed in the edge portion 10SS within the region 10C corresponding to the cross region 52C and into a continuously or intermittently circular or substantially circular shape centered at or substantially centered at the first spacer 55A.

An interlayer insulating film 18 is formed by an inorganic insulating film over the first substrate 11 so as to cover the gate lines 12 thus formed, the source lines 14 thus formed, a TFT, and a pixel electrode (step S109). A common electrode 19 is formed by a transparent conductive film over the interlayer insulating film 18 thus formed (step S111). A first alignment film 20 is formed by polyimide resin over the interlayer insulating film 18 so as to cover the common electrode 19 thus formed, with a front surface of the first alignment film 20 subjected to an alignment process (step S113). In steps S101 and S107, the bank-use gate portion 12a and the bank-use source portion 14a are formed, respectively. Therefore, in steps S109 to S113, the interlayer insulating film 18, the common electrode 19, and the first alignment film 20 are formed over the bank-use gate portion 12a and the bank-use source portion 14a into projecting shapes projecting toward the color filter substrate 50. That is, since, in steps S101 and S107, the bank-use gate portion 12a and the bank-use source portion 14a are formed, respectively, a bank portion BK is formed in step S113 in a position surrounding the first spacer 55A and into a continuously or intermittently circular or substantially circular shape centered at or substantially centered at the first spacer 55A.

Effects of the First Embodiment

In the liquid crystal display panel 100 according to the embodiment, the top 55At of the first spacer 55A and the top BKt of the bank portion BK are in such a relationship as to make contact with each other in a height direction (thickness direction). Therefore, the first spacer 55A makes contact with the bank portion BK when having shifted toward the right or the left in the presence of the application of an external force to the liquid crystal display panel 100. For this reason, movement of the first spacer 55A is inhibited by the bank portion BK, so that the first spacer 55A does not shift further in a transverse direction. Therefore, the bank portion BK functions as a stopper that inhibits a shift of the first spacer 55A.

Since a shift of the first spacer 55A is inhibited by the bank portion BK, a shift of the active matrix substrate 10 with respect to the color filter substrate 50 too is inhibited. Therefore, in the liquid crystal display panel 100 according to the embodiment, the range of movement of the first spacer 55A in contact with the first alignment film 20 due to a deflection or deformation caused by an external force can be made smaller than in the liquid crystal display panel 100A according to the comparative example (FIGS. 1 and 2), which does not have a stopper. As a result, the range of disruption of the alignment of the liquid crystal layer too is made smaller than in the liquid crystal display panel 100A according to the comparative example.

The bank portion BK is disposed in the region 10C overlapping the cross region 52C of the black matrix 52 in planar view. Therefore, the range of movement of the first spacer 55A in contact with the first alignment film 20 can fall within the region 10C. In other words, in the liquid crystal display panel 100 according to the embodiment, a position C2 of disruption of the alignment of the liquid crystal layer falls within the region 10C, so that the alignment of the liquid crystal does not become disrupted out of the cross region 52C. Therefore, in the liquid crystal display panel 100 according to the embodiment, the disruption of the alignment of the liquid crystal layer is brought out of sight by the black matrix 52. This results in a reduction in display unevenness.

Furthermore, in the liquid crystal display panel 100 according to the embodiment, the bank-use gate portion 12a and the bank-use source portion 14a are provided in an edge portion 10SS of the region 10C. This allows the first spacer 55A, i.e. the color filter substrate 50, to move to the edge portion 10SS when an external force is applied to the liquid crystal display panel 100. That is, the active matrix substrate 10 and the color filter substrate 50 are allowed to deflect and deform as long a distance as the distance to the edge portion 10SS. This results in relaxation of a stress that is placed on the liquid crystal display panel 100 by an external force.

Furthermore, in the liquid crystal display panel 100 according to the embodiment, the bank portion BK is formed by the gate layer 12A, which the first alignment film 20 covers, including the bank-use gate portion 12A and the source layer 14A, which the first alignment film 20 covers, including the bank-use source portion 14a. Thus, in the liquid crystal display panel 100 according to the embodiment, the active matrix substrate 10 can be manufactured without preparing, separately from the gate layer 12A and the source layer 14A, a layer for forming the bank portion BK. This brings about a reduction in manufacturing cost.

Second Embodiment

In the liquid crystal display panel 100 according to the first embodiment, the bank portion BK provided in the active matrix substrate 10 is formed by the gate layer 12A and the source layer 14A, which the first alignment film 20 covers, including the bank-use gate portion 12a and the bank-use source portion 14a, respectively, i.e. by both the gate layer 12A and the source layer 14A. However, the bank portion BK needs only be formed by at least either the bank-use gate portion 12a and the bank-use source portion 14a being provided. That is, the bank portion BK needs only be formed by at least either the gate layer 12A or the source layer 14A.

Figure 7:
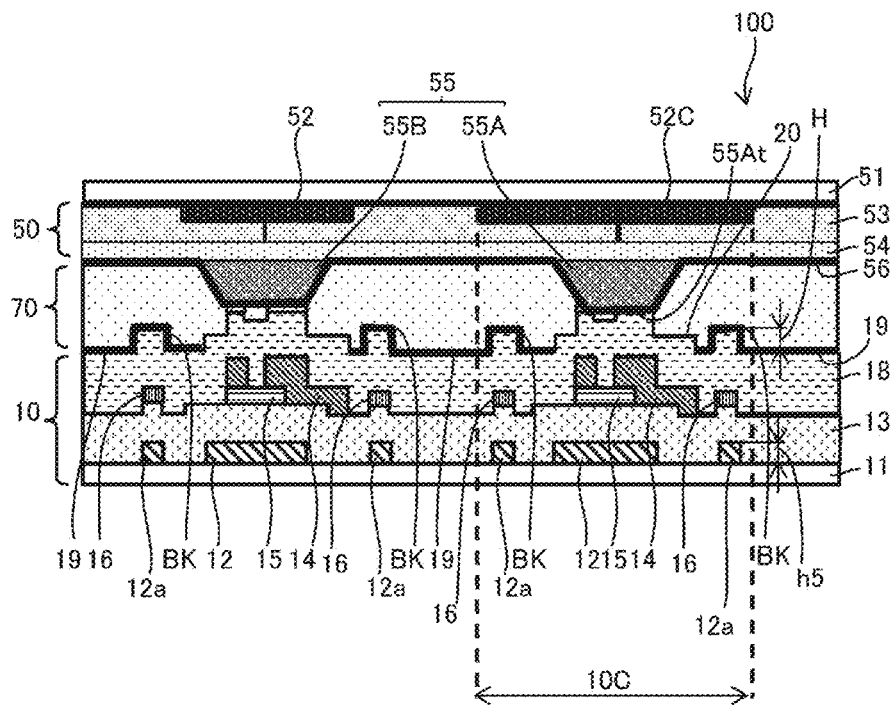
FIG. 7 is a schematic cross-sectional view of a liquid crystal display panel according to a second embodiment.

FIG. 7 is a schematic cross-sectional view of a liquid crystal display panel 100 according to a second embodiment. In the liquid crystal display panel 100 according to the second embodiment, as another example, the bank portion BK is formed by the gate layer 12A having the bank-use gate portion 12a, i.e. by the gate layer 12A.

Figure 8:
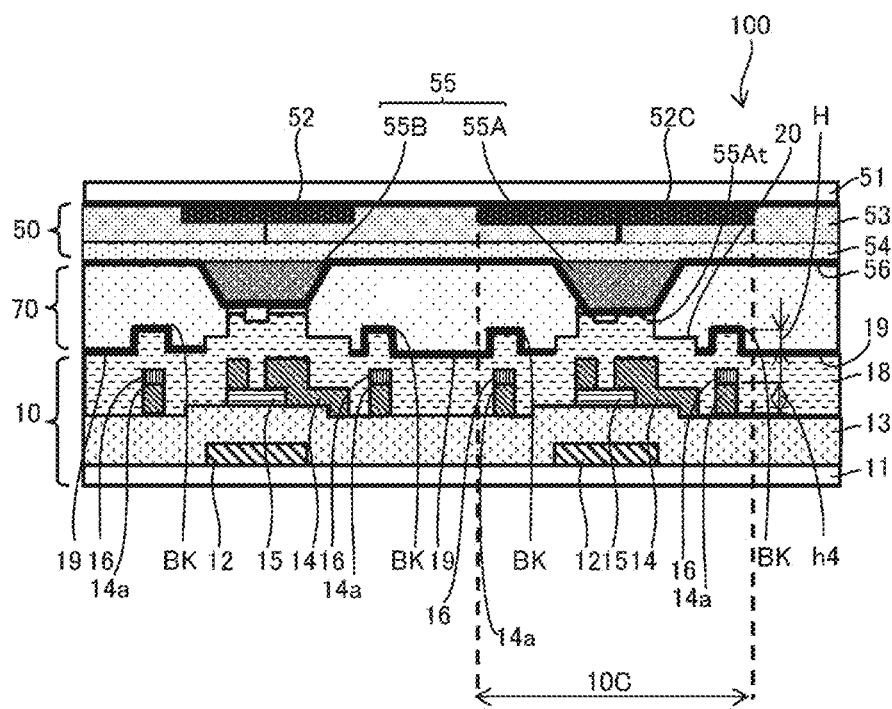
FIG. 8 is a schematic cross-sectional view of another example of a liquid crystal display panel according to the second embodiment.

FIG. 8 is a schematic cross-sectional view of another example of a liquid crystal display panel 100 according to the second embodiment. In another example of a liquid crystal display panel 100 according to the second embodiment, the bank portion BK is formed by the source layer 14A having the bank-use source portion 14a, i.e. by the source layer 14A.

In the case of FIG. 7 or 8, the height h5 of the bank-use gate portion 12a or the height h4 of the bank-use source portion 14a is approximately 1/7 to 1/11 of the height h1 of the first spacer 55A. As one example, assuming that the height h1 of the first spacer 55A is 2.14 to 2.50 μm, the height h5 of the bank-use gate portion 12a or the height h4 of the bank-use source portion 14a is approximately 0.19 to 0.36 μm. Thus, as in the case of the liquid crystal display panel 100 according to the first embodiment, the first spacer 55A makes contact with the bank portion BK when having shifted in a transverse direction in the presence of the application of an external force to the liquid crystal display panel 100. Therefore, movement of the first spacer 55A is inhibited by the bank portion BL, so that the bank portion BK can function as a stopper that inhibits a shift of the first spacer 55A.

The foregoing description assumes that as a stopper that inhibits a shift of the first spacer 55A, the bank portion BK is disposed in a position surrounding the first spacer 55A within the region 10C overlapping, in planar view, the cross region 52C of the black matrix 52 in which the first spacer 55A is provided. However, the bank portion BK may further include a portion disposed as a stopper that inhibits a shift of the second spacer 55B.

Figure 9:
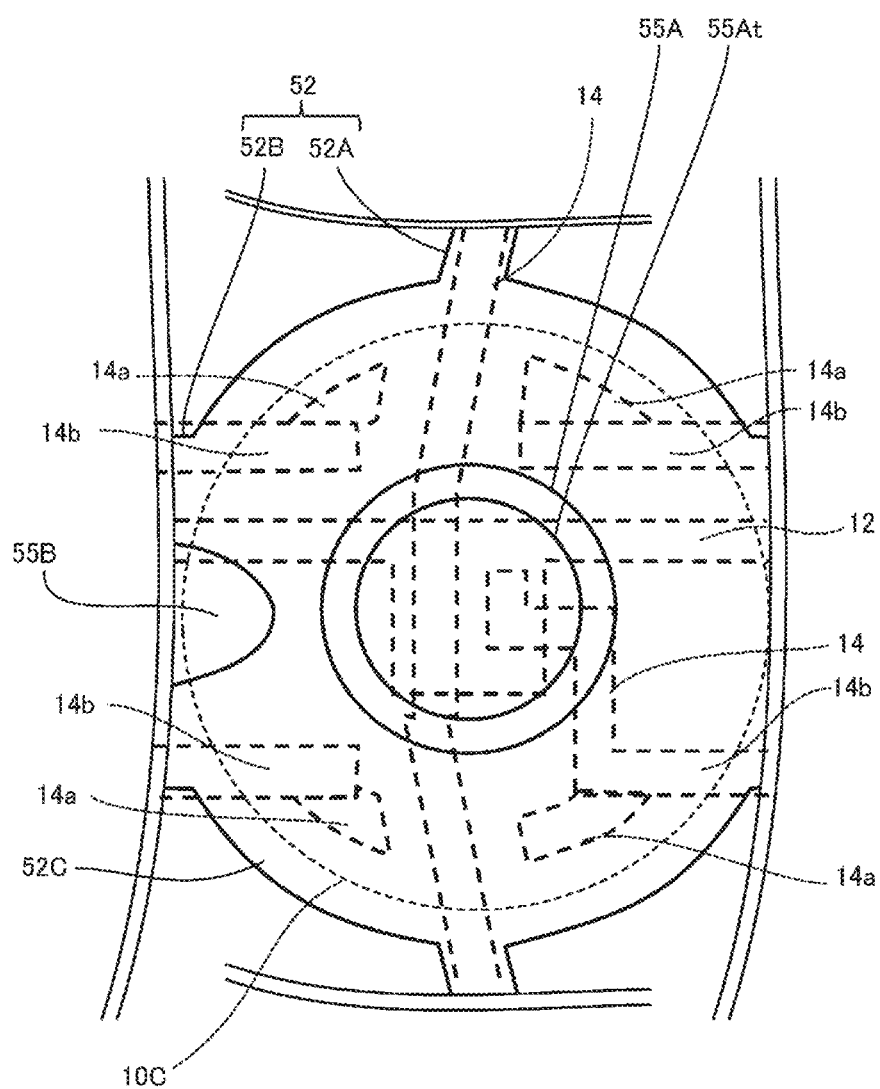
FIG. 9 is a schematic plan view of part of a color filter substrate of a liquid crystal display panel according to a third embodiment.

FIG. 9 is a schematic plan view of part of a color filter substrate 50 of a liquid crystal display panel 100 according to a third embodiment. FIG. 9 illustrates an example, shown in the second embodiment, in which the bank portion BK is formed by the source layer 14A having the bank-use source portion 14a. In the liquid crystal display panel 100 according to the third embodiment, the source layer 14 further includes a second bank-use source portion 14b. The second bank-use source portion 14b is disposed within the region 10C so as to be parallel to a gate line 12 around the first spacer 55A and the second spacer 55B. This causes the bank portion BK to be also formed in a position within the region 10C that is parallel to a gate line 12 around the first spacer 55A and the second spacer 55B. By the bank portion BK being thus formed, a shift of the second spacer 55B too is inhibited in a case where the second spacer 55B has an elliptical shape and is placed side by side with the first spacer 55A.

Further, as another example, as shown in FIGS. 4, 7, and 8, at least either the bank-use gate portion 12a or the bank-use source portion 14a may be further disposed in a position surrounding the second spacer 55B within the region 10C overlapping, in planar view, the cross region 52C in which the second spacer 55B is provided. With this, a shift of the first spacer 55A is inhibited, and the bank portion BK also inhibits a shift of the second spacer 55B when the external force being applied increases. This brings about a reduction in display unevenness.

Further, as another example, the bank portion BK may be disposed in a position surrounding the second spacer 55B within the region 10C overlapping, in planar view, the cross region 52C in which the second spacer 55B is provided instead of the region 10C overlapping, in planar view, the cross region 52C in which the first spacer 55A is provided. In this case too, the bank portion BK also inhibits a shift of the second spacer 55B when the external force being applied increases. This makes it possible to reduce a shift of the color filter substrate 50 with respect to the active matrix substrate 10 in the presence of the application of a great external force. Therefore, in this case too, display unevenness is further reduced than in the liquid crystal display panel according to the comparative example, which does not have a bank portion BK.

Modification

The foregoing description assumes that the bank portion BK is formed by at least either the gate layer 12A or the source layer 14A including the bank-use gate portion 12a or the bank-use source portion 14a, which is a bank-use portion. However, it is not of importance that at least either the gate layer 12A or the source layer 14A include a bank-use portion. That is, it is not of importance that the bank portion BK be formed by at least either the gate layer 12A or the source layer 14A. A layer different from the gate layer 12A and the source layer 14A may include a bank-use portion. That is, the bank portion BK may be formed by a layer different from the gate layer 12A and the source layer 14A. Even in this case, the bank portion BK is formed and can function as a stopper that inhibits a shift of the first spacer 55A.

4. Additional Statement

The present disclosure is not limited to the aforementioned embodiments but may be variously modified.

It should be understood by those skilled in the art that various modifications, combinations, sub-combinations and alterations may occur depending on design requirements and other factors insofar as they are within the scope of the appended claims or the equivalents thereof.

What is claimed is:

1. A liquid crystal display panel comprising:
an active matrix substrate;
a color filter substrate placed opposite the active matrix substrate; and
a liquid crystal layer disposed between the active matrix substrate and the color filter substrate,
wherein
the active matrix substrate includes
a gate layer including a plurality of gate lines extending in a first direction,
a source layer including a plurality of source lines crossing the plurality of gate lines and extending in a second direction, and
an alignment film covering the gate layer and the source layer,
the color filter substrate includes
a black matrix including, in a planar view, a plurality of first portions separately overlapping each of the plurality of source lines of the active matrix substrate and a plurality of second portions crossing the plurality of first portions and separately overlapping each of the plurality of gate lines, and
spacers, disposed in at least some of a plurality of cross regions in which the plurality of first portions and the plurality of second portions cross each other, that project toward the active matrix substrate, and
the active matrix substrate further includes bank portions, provided in positions surrounding the spacers within regions overlapping the cross regions in the planar view, that project toward the color filter substrate, wherein
each of the spacers includes a first spacer and a second spacer, and
each of the bank portions includes a first bank and a second bank, the first bank is positioned surrounding the first spacer, and the second bank is positioned parallel to each of the plurality of gate lines around the first spacer and the second spacer.

2. The liquid crystal display panel according to claim 1, wherein each of the bank portions is disposed in an edge portion of a corresponding one of the regions overlapping the cross regions in the planar view.

3. A display device comprising the liquid crystal display panel according to claim 1.

4. A method for manufacturing an active matrix substrate that is mounted in a liquid crystal display panel, the method comprising:
forming, over a substrate, a gate layer including a plurality of gate lines extending in a first direction;
forming, at a layer above the gate layer, a source layer including a plurality of source lines crossing the plurality of gate lines and extending in a second direction; and
forming, at a layer above the source layer, an alignment film covering the gate layer and the source layer, wherein
in the liquid crystal display panel, a color filter substrate placed opposite the active matrix substrate behind a liquid crystal layer includes: a black matrix including, in a planar view, a plurality of first portions separately overlapping each of the plurality of source lines of the active matrix substrate and a plurality of second portions crossing the plurality of first portions and separately overlapping each of the plurality of gate lines; and spacers, disposed in at least some of a plurality of cross regions in which the plurality of first portions and the plurality of second portions cross each other, that project toward the active matrix substrate,
at least one of forming the gate layer or forming the source layer includes forming, in positions surrounding the spacers within regions overlapping the cross regions in the planar view, bank portions projecting toward the color filter substrate, wherein
each of the spacers includes a first spacer and a second spacer, and
each of the bank portions includes a first bank and a second bank, the first bank is positioned surrounding the first spacer, and the second bank is positioned parallel to each of the plurality of gate lines around the first spacer and the second spacer.

5. The liquid crystal display panel according to claim 1, wherein a height of the first spacer is greater than a height of the second spacer.

* * * * *